United States Patent [19]
Lando

[11] 3,776,770
[45] Dec. 4, 1973

[54] METHOD OF SELECTIVELY DEPOSITING A METAL ON A SURFACE OF A SUBSTRATE

[75] Inventor: David Jacob Lando, Lawrence Twsp., Mercer City, N.J.

[73] Assignee: Western Electric Company Incorporated, New York, N.Y.

[22] Filed: Oct. 8, 1971

[21] Appl. No.: 187,633

[52] U.S. Cl. .............. 117/212, 117/93.3, 117/47 R, 117/213
[51] Int. Cl. .......................... B44d 1/50, H05k 3/12
[58] Field of Search ................... 117/93.3, 212, 213, 117/47 R, 47 A

[56] References Cited

UNITED STATES PATENTS

| | | | |
|---|---|---|---|
| 3,562,005 | 2/1971 | DeAngelo et al. | 117/93.3 X |
| 3,492,151 | 1/1970 | Cescon | 117/93.3 X |
| 3,431,150 | 3/1969 | Dolan, Jr. et al. | 148/1.5 |

*Primary Examiner*—Ralph S. Kendall
*Attorney*—W. M. Kain et al.

[57] ABSTRACT

A method of selectively depositing a metal on a surface of a substrate is disclosed. The method comprises sensitizing the surface with a photosensitive sensitizing solution selected from the group of sensitizing solutions comprising (a) an aqueous solution comprising $Sn^{+2}$ ions, $Sn^{+4}$ ions and HF, (b) an aqueous solution comprising $Pb^{+2}$ ions, $Pb^{+4}$ ions and HF, (c) an aqueous solution comprising $Ti^{+2}$ ions, $Ti^{+4}$ ions, and HF and (d) an aqueous solution comprising $Fe^{+3}$ ions and HF. The sensitized surface is then selectively exposed to a source of short wavelength ultraviolet radiation (less than 3,000A) to form a latent pattern capable of reducing an activating metal from an activating metal salt. The ultraviolet radiation pattern delineated or formed substrate is then treated with a solution comprising the activating metal salt, to deposit on the pattern the activating metal. The activating-deposited surface is then exposed to an electroless plating bath, which is catalyzed by the reduced activating metal, to produce an electroless metal-deposited pattern.

10 Claims, 3 Drawing Figures

INVENTOR
D. J. LANDO
BY J. Rosenthal
ATTORNEY

METHOD OF SELECTIVELY DEPOSITING A METAL ON A SURFACE OF A SUBSTRATE

BACKGROUND OF THE INVENTION

1. Field of the Invention

This invention relates to a method of selectively depositing a metal on a surface of a substrate and more particularly, to a method of adherently depositing a metal on a surface of a semiconductor substrate.

2. Description of the Prior Art

Ion implantation is a method for doping semiconductors. In this method, dopant ions or impurity particles, i.e., materials which change the conductivity of a semiconductor body either in type or magnitude, are accelerated to energies ranging from 10 keV to several MeV and are literally driven into the semiconductor body or substrate. The energetic, speedy dopant ions or impurity particles are obtained with ion accelerators, such as the Van de Graaf, Cockroft-Walton, double or triple gap, constant gradient or ion separation system.

Conventional ion-implantation methods comprise directing a beam of the dopant ions or impurity particles onto a surface of the semiconductor body. Suitable masks are employed whereby the implanted ions resulting from the directed beam are implanted in the semiconductor body or substrate in a preselected pattern. The mask employed may be an ion absorbing oxide if the energy of the ions to be implanted does not exceed 400 kV. The thickness of the oxide required to absorb ions of higher energies would create an undesirable loss in resolution because of undercutting of the oxide which prevents narrowly spaced quantities of implanted material, e.g., where a grid is implanted in semiconductor devices.

In the alternative and more desirable, a metal mask such as Au, Pt, Ag, or Pd can be used. Au, for example, has an absorption factor of about 5 to 1 over most oxides. In fabricating the metal mask on the semiconductor substrate an intermediate layer, e.g., an oxide, is first deposited on the semiconductor substrate, e.g., silicon, whereafter the metal to be employed as the mask is deposited thereon through evaporation or sputtering. The oxide layer is provided to improve the adhesion of the metal mask deposit to the surface of the substrate.

Adequate adhesion of the metal mask deposit, e.g., Pd, to the semiconductor surface, e.g., a silicon surface, is an inherent problem when using metal masks and has heretofore precluded adequate electroless metal deposition techniques for directly forming and depositing the metal masks on the semiconductor surface. A method whereby the metal mask can be deposited directly onto the semiconductor surface without the use of an adhesive layer, comprising an oxide and/or a strike or flash of chromium metal (which can't function as an adequate ion-implantation mask), is therefore needed.

Another difficulty in the formation and employment of metal ion-implantation masks is the need for masking the semiconductor surface when forming the metal mask directly on the surface thereof. A method whereby the metal ion-implantation mask can be patterned and formed directly without the use of masking and/or etching techniques is desired, especially from an economic point of view.

When several ion-implanted regions are formed on a semiconductor substrate to form an integrated circuit, various ohmic contacts and interconnections have to be provided on the semiconductor surface. An inherent problem in the formation of these conductive metal ohmic contacts and interconnections, comprising, for example, Pt, Pd, Au, Ni, etc., is, as stated previously, the adhesion of the deposited metal, e.g., Pd, to the semiconductor substrate, e.g., silicon. Another problem is that conventional masking and etching techniques are utilized in the formation of these ohmic contacts and interconnections leading to undercutting thereof and/or poor resolution of their patterns. A method whereby these ohmic contacts and interconnections can be directly formed in an adherent manner by a photoimaging technique, which leads to much better pattern resolution, is therefore desired and needed.

SUMMARY OF THE INVENTION

The present invention relates to a method of selectively depositing a metal on a surface of a substrate and more particularly, to a method of adherently depositing a metal on a surface of a semiconductor substrate.

The method includes treating a semiconductor surface with a photosensitive aqueous sensitizing solution, comprising at least one ionic species of an element, selected from the group consisting of tin, lead, titanium and iron, combined with HF, whereby the semiconductor surface is sensitized. Areas of the resultant sensitized surface are then selectively exposed to a source of ultraviolet radiation to form a pattern, capable of reducing an activating metal ion to an activation metal, on the semiconductor surface. The patterned surface is then exposed to a suitable activating solution, comprising the activating metal ion, e.g., $Pd^{+2}$, whereby the activating metal, e.g., Pd, is deposited on the patterned semiconductor surface. The resultant activated metal-deposited surface is then exposed to a suitable electroless plating bath, which is catalyzed by the reduced activating metal to produce an electroless metal-deposited pattern. The electroless metal-deposited substrate may then be exposed to a suitable electroplating bath to build up an electroplated metal pattern thereon. The resultant activated metal-deposited pattern or electroplated metal pattern may then be used, depending upon the ultraviolet light patterning, and the metal deposited, as an ion-implantation mask, an ohmic contact or an interconnection.

The method is one which optimizes depositing a metal pattern on a semiconductor substrate by (1) eliminating the necessity for masking and/or etching, (2) eliminating the need for blanket metallization of the semiconductor surface, thereby leading to an economic benefit, especially in the case of gold, Pt and Pd, (3) eliminating the use of oxide or metal adhesive layers and (4) providing a means of patterning the metal deposit which results in an improved pattern resolution thereof.

DESCRIPTION OF THE DRAWINGS

The present invention will be more readily understood by reference to the following drawing taken in conjunction with the detailed description, wherein.

DETAILED DESCRIPTION

Figure 1:
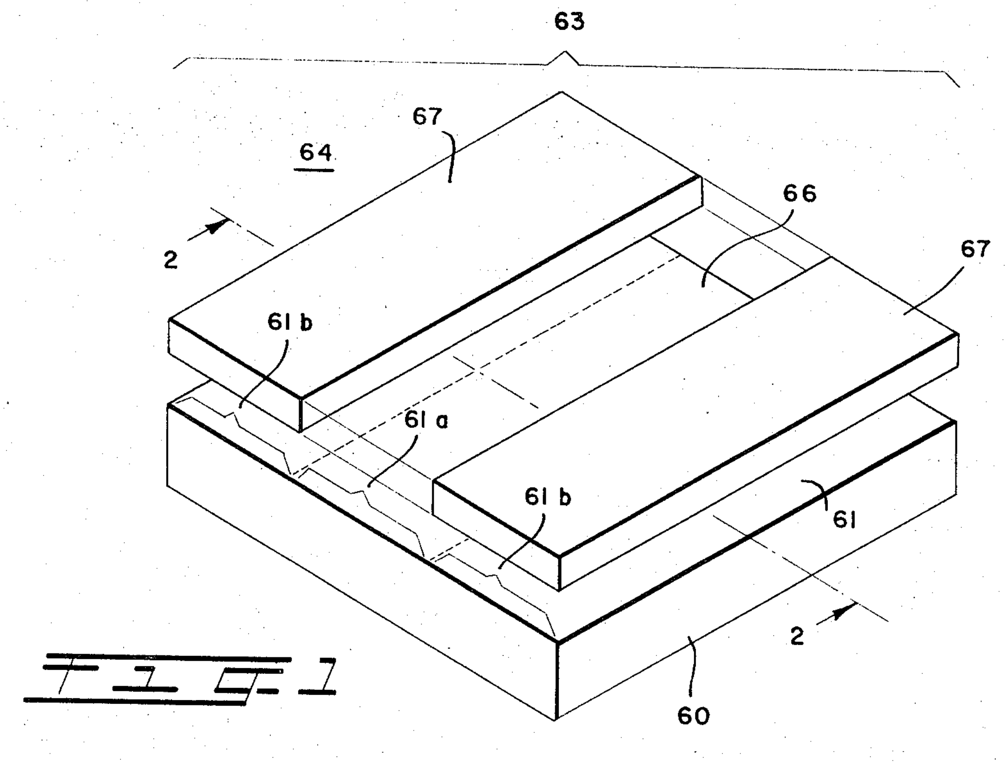
FIG. 1 is an isometric view of a sensitized semiconductor substrate selectively exposed to a source of ultraviolet radiation through a mask.

The present invention is described primarily in terms of depositing palladium and copper onto a surface of a silicon substrate. However, it will be understood that such description is exemplary only and is for purposes of exposition and not for purposes of limitation.

It will be readily appreciated that the inventive concept is equally applicable to semiconductor materials other than silicon, including materials selected from among the groups III(a)–V(a), e.g., indium antimonide, and II(b)–VI(a) compounds or group IV elements of the Periodic Table of the Elements as set forth in the Mendelyeev Periodic Table appearing on page 132 of the 45th edition of the Handbook of Chemistry and Physics, published by the Chemical Rubber Company. It will be readily appreciated that the inventive concept is equally applicable to depositing any metal which can be compatibly electrolessly deposited and/or electroplated upon the surface of the semiconductor substrate selected.

A surface of a suitable substrate, e.g., silicon, germanium, silicon-germanium alloys, III(a)–V(a) compounds, II(b)–VI(a) compounds, is initially thoroughly cleaned, employing standard means and procedures known in the art to one skilled therein. For a substrate comprising silicon, a preferred cleaning procedure comprises immersing the silicon substrate in a saturated cleaning solution, an example of which is a saturated solution of $CrO_3$ in $H_2SO_4$. The solution may be maintained at a temperature in the range of 20° to 140°C, typically, a practical range being 20° to 60°C. Typically, the silicon is maintained in the cleaning solution, maintained at 20°–60°C, for a period of time ranging from 1 minute to 30 minutes. It is to be noted that ultrasonic agitation or any other form of solution agitation may be employed while the substrate is maintained in the saturated $CrO_3$ cleaning solution. The silicon substrate is then removed from the $CrO_3$ cleaning solution and is thoroughly washed with deionized water for several minutes, at room temperature, typically 1 to 5 minutes. It is, of course, understood that the exposure time to the $CrO_3$ cleaning solution is interdependent on temperature and the time periods given above for a temperature in the range of from 20° to 60°C is exemplary only and is not limiting. The time-temperature parameters are easily ascertainable by one skilled in the art.

The cleaned semiconductor substrate, e.g., silicon, is then sensitized with a suitable sensitizing solution. A suitable sensitizing solution is one which (1) is capable of being patterned by short wavelength ultraviolet radiation (less than 3,000A), i.e., it is photosensitive, (2) is capable of reducing an activating metal ion, e.g., $Pd^{+2}$, to the metal, e.g., Pd, and (3) is capable of rendering a semiconductor substrate surface more susceptible to the adhesion of a subsequent electroless metal deposition. It is important to note that prior to sensitization, the cleaned semiconductor substrate should not be permitted to dry, i.e., the cleaned substrate should be maintained in a condition whereby it is wet with water or any other conventional solvent used in the cleaning thereof. If the semiconductor substrate is allowed to dry there is a possibility that dust or other foreign particles will be drawn to the surfaces thereof and thereby lead to a spotty or irregular metal deposition, to which the substrate is destined to be subjected.

A suitable photosensitive sensitizing solution is one comprising (1) at least one ionic species selected from the group of elements consisting of tin, lead, titanium and iron, and (2) HF. Such suitable sensitizing solutions are (a) aqueous solutions comprising $Sn^{+2}$ ions, $Sn^{+4}$ ions and HF, (b) aqueous solutions comprising $Pb^{+2}$ ions, $Pb^{+4}$ ions and HF, (c) aqueous solutions comprising $Ti^{+2}$ ions, $Ti^{+4}$ ions and HF and (d) aqueous solutions comprising $Fe^{+3}$ ions and HF. The ionic species may be added to water in the form of any suitable water soluble salt or compound, e.g., in form of iodides, bromides, sulfates, etc. A preferred salt, however, is a chloride. This preference is based upon the solubility thereof and upon the fact that with chloride salts very stable colloids are formed, i.e., oxy-chloride colloids.

For a sensitization exposure at 25°C, the suitable sensitizing solutions have critical compositions where (1) the $Sn^{+2}$ ions or $Pb^{+2}$ ions or $Ti^{+2}$ ions are initially present in a concentration ranging from 0.03 to 0.07 moles/liter of solution, with a preferred concentration being 0.05 moles/liter of solution; (2) the $Sn^{+4}$ ions or $Pb^{+4}$ ions or $Ti^{+4}$ ions are initially present in a concentration ranging from 0.02 to 0.06 moles/liter of solution, with a preferred concentration being 0.04 moles/-liter of solution; and (3) the hydrofluoric acid is present in a concentration ranging from 0.24 to 0.29 moles/liter of solution, with a preferred concentration being 0.26 moles/liter of solution. For the iron sensitizing solution the critical composition comprises (1) $Fe^{+3}$ ions initially present in a concentration ranging from 0.3 to 0.7 moles/liter of solution, with a preferred concentration being 0.5 moles/liter of solution; and (2) hydrofluoric acid being present in a concentration ranging from 0.24 to 0.29 moles/liter of solution, with a preferred concentration being 0.26 moles/liter of solution. It is, of course, to be understood and stressed that the above concentration and temperature parameters are interdependent and that variations in the temperature may produce variations in the other parameter whereby optimum results will be attained. In this regard, the various parameters and their interdependency can be easily ascertained experimentally by one skilled in the art.

The compositions of the various sensitizing solutions are critical since deviations in the concentration of the various constituents will result in a sensitizing solution which (1) is not photosensitive or (2) leads to an ultimate electroless metal deposition and/or an electrodeposition which is not adequately adherent to the semiconductor surface. If the concentrations of the various ionic species, $Sn^{+2}$ and $Sn^{+4}$, $Pb^{+2}$ and $Pb^{+4}$, $Ti^{+2}$ and $Ti^{+4}$, $Fe^{+3}$ are below the lower limit of their respective ranges, then the sensitizing solutions lose their photosensitive ability. If the concentrations of the various ionic species $Sn^{+2}$ and $Sn^{+4}$, $Pb^{+2}$ and $Pb^{+4}$, $Ti^{+2}$ and $Ti^{+4}Fe^{+3}$ are above the upper limit of their respective ranges, then the electroless metal deposition and/or the electrodeposition of the metal destined to be deposited on the surface of the semiconductor substrate is deposited thereon in a non-adherent form.

The concentration of the hydrofluoric acid is extremely critical. It should be noted here that it is surprising that combining hydrofluoric acid with the various ionic species in solution does not destroy the ability of these various ionic species to render a surface of the semiconductor photosensitive. Normally, it is expected that the HF will react with the surface of the semiconductor and the thus rendered surface will react further with water and passivate. Such, however, has not been found to occur. If the concentration of the HF is below 0.24 moles/liter of solution, the adhesion of the resultant electroless and/or electro metal deposition to which the semiconductor substrate is to be subjected is not adequate. If the concentration of the HF is above 0.29 moles/liter of sensitizing solution, a pitted semiconductor surface results when the sensitizing solution is applied thereto at a temperature of 25°C for a time period typically ranging from 5 to 180 seconds.

The manner in which the sensitizing solution is prepared has been found to be very important and affects both the photosensitivity of the sensitizing solution and the adhesion of the subsequent metal deposition (electroless and/or electro-) to which the semiconductor substrate is destined to be subjected. For those sensitizing solutions comprising a high valence ionic species of an element, i.e., $Sn^{+4}$ or $Pb^{+4}$ or $Ti^{+4}$ and a low valence ionic species of the same element, i.e., $Sn^{+2}$ or $Pb^{+2}$ or $Ti^{+2}$, it has been found that both properties, i.e., the photosensitivity and the adhesive properties are optimized by preparing the sensitizing solution so that a fraction, typically 40 to 50 percent of the total concentration of the low valence species ($Sn^{+2}$, $Pb^{+2}$, $Ti^{+2}$) in the form of appropriate salts, e.g., chloride, bromide, iodide, sulfate, etc., is first added to water. The total concentration of the higher valence species ($Sn^{+4}$, $Pb^{+4}$, $Ti^{+4}$) in appropriate salt form, is then added to and dissolved in the resultant solution. After complete dissolution is obtained, the remaining amount of the lower valence ionic species containing salt or compound is then added and completely dissolved. The hydrofluoric acid is then added to the resultant solution whereby the sensitizing solution is obtained.

Preferably, prior to adding the HF, the resultant solution comprising both the higher valence ionic species and the lower valence ionic species is thermally aged, typically for 24 hours at 25°C. It is, of course, understood that the time-temperature parameters for thermally aging the resultant solution are interdependent. This interdependency is one which is well known in the art or can be easily ascertained experimentally. Alternatively to or concurrently with the thermal aging, the resultant high and low valence ionic species containing solutions may have oxygen bubbled therethrough, typically from 10 to 60 minutes at 25°C. The HF is then added to the pretreated, i.e., thermally aged and/or oxygen bubbled, high and low valence ionic species containing solution to obtain the sensitizing solution.

For the iron containing sensitizing solution, the selected ferric salt is first dissolved in the water and then the desired concentration of HF is added thereto. Again, preferably the resultant solution is thermally aged and/or oxygen bubbled prior to the addition of HF, whereby a resultant sensitizing solution is obtained which (1) has optimal photosensitivity and (2) leads to optimal adhesion of deposited metal (electroless and/or electro) to the semiconductor surface.

A surface of the cleaned semiconductor substrate, e.g., Si, is immersed in the suitable sensitizing solution for a period of time sufficient to (1) adequately sensitize the surface and (2) render the surface more adhesive to the subsequent electroless and/or electro metal deposition to which the surface is destined to be subjected. Typically, at a temperature of 25°C, a sufficient period of time ranges from 5 to 180 seconds. A preferred period of time is 15 seconds. Again, it is understood that the time-temperature parameters are interdependent and that variations in the temperature will produce variations in the time whereby optimum results are obtained. In this regard, the time-temperature parameters of sensitization and their interdependency are easily ascertainable experimentally by one skilled in the art.

After sensitizing the semiconductor surface, the sensitized surface may be rinsed in deionized water, typically for a time period ranging from 30 to 60 seconds at 25°C. The sensitized surface, which may be water rinsed, is then dried, e.g., air dried, whereby a sensitizing residue resulting from the sensitizing solution is left thereon. This residue is retained by the semiconductor surface by a mechanism which is not clear. It is hypothesized that such retention may be due to physical forces, adsorption, chemisorption, or the like. The drying of the semiconductor surface after sensitizing is a desirable expedient. The sensitized surface is destined to be subsequently exposed to a source of short (about 1,800A to about 2,900A) wavelength ultraviolet radiation. If the surface is not dried, a liquid layer remains on the substrate surface which may attenuate to some extent the chemical action which the ultraviolet radiation is intended to effect on the sensitized surface.

Areas of the sensitized surface are then selectively exposed to the source of short wavelength ultraviolet radiation (1,800 – 2,900A), through a suitable mask, whereby a desired pattern of the sensitized surface, capable of reducing an activating metal ion, e.g., $Pd^{+2}$, to an activating metal, e.g., Pd, upon exposure to an activating solution, e.g., a $PdCl_2$ solution, is obtained or delineated. Where the sensitizing solution comprises tin ions or lead ions or titanium ions, the sensitizing solution is a positive one and those areas exposed to the ultraviolet radiation are oxidized by the ultraviolet radiation to the higher valence state and so are rendered incapable of so reducing the activating metal ion, e.g., $Pd^{+2}$, to the activating metal, e.g., Pd. Those areas not exposed are so capable since $Sn^{+2}$ or $Ti^{+2}$ or $Pb^{+2}$ ions are still present. Where the sensitizing solution comprises iron ions ($Fe^{+3}$), the sensitizing solution is a negative sensitizing solution and those areas which are sensitized thereby and exposed to the ultraviolet radiation are reduced by the exposure to the lower valence state ($Fe^{+2}$) and so are rendered capable of reducing the activating metal ion, e.g., $Pd^{+2}$, to the activating metal, e.g., Pd. Those areas not so exposed are not so capable ($Fe^{+3}$ ions being incapable of being oxidized further by the activating metal ion, e.g., $Pd^{+2}$).

A suitable mask is one which permits short wavelength ultraviolet radiation to pass therethrough and has at least one opaque pattern thereon which attenuates the short wavelength ultraviolet radiation. Some typical masks comprise quartz, quartz-related glasses and borosilicate bodies which have black ink, Ruby Lith or photoresist patterns thereon, which patterns attenuate the short wavelength ultraviolet radiation. The type of mask is dictated by the character of the sensitizing solution. Specifically, if a positive solution is used, the mask is a positive mask which permits radiation to strike the sensitized surface only where a metallic pattern is not ultimately desired. If the negative sensitizing solution ($Fe^{+3}$ containing) is used, the mask is a negative mask which permits the radiation to strike the sensitized surface only where a metallic pattern is desired.

After selectively exposing the sensitized surface to ultraviolet radiation, whereby the activating metal ion reducing pattern, comprising selected areas of the sensitized surface, is obtained, the surface is then activated. Activation relates to providing a deposit of a catalytic metal, e.g., noble metals such as Ir, Os, Pd, Pt, Rh, Ru, Au, Ag, over areas of the semiconductor surface, comprising the pattern, in sufficient quantities to successfully catalyze a plating reaction once the semiconductor surface is introduced into an electroless plating bath. The pattern, so capable of reducing an activating metal, e.g., Pd, from an activating metal salt, e.g., $PdCl_2$, is exposed to the activating salt, e.g., $PdCl_2$, whereby the activating metal salt is reduced to the activating metal, e.g., Pd, which in turn is deposited thereon. The deposited activating metal, e.g., Pd, acts as a catalyst for localized further plating. It is to be understood that the various activating metal ions and their solutions, the conditions and procedures of activation and are well known in the art and will not be elaborated herein. Such activators and procedures may be found, in part, in Metallic Coating of Plastics, William Goldie, Electrochemical Publications, 1968.

After activation, the activating metal-deposited substrate may be rinsed with water, typically for about 1 minute at 25°C, whereafter it is immersed in a standard electroless plating bath containing a metal ion, e.g., $Cu^{+2}$, destined to be reduced by the catalytic activating metal species, e.g., Pd. The metal ion, $Cu^{+2}$, is reduced by the activating metal, e.g., Pd, and is electrolessly deposited on the substrate to form an adherent electroless metal-deposited pattern thereon. It is to be pointed out that the electroless baths, the electroless plating conditions and procedures are well known in the art and will not be elaborated herein. Reference is again made to Metallic Coating of Plastics, for some typical examples of electroless baths and plating parameters.

Where it is desired to build up the electroless metal-deposited pattern, the electroless metal deposit is subjected to a conventional electroplating treatment whereby the electroless metal deposit is built up with either the same metal or a different metal, depending of course, upon the application of the deposited pattern.

It is to be pointed out that the deposited electroless and/or electroplated pattern on the semiconductor surface may be employed as a mask (ion implantation), an ohmic contact or an interconnection. Referring to FIG. 1, a surface 61 of a semiconductor substrate 60, e.g., n-type silicon, is first cleaned by immersing the substrate 60 in the saturated solution of $CrO_3$ in $H_2SO_4$. The cleaned surface 61 is then sensitized with a positive sensitizing solution, e.g., $Sn^{+2}$, $Sn^{+4}$ and HF containing aqueous solution. The sensitized surface 61 is water rinsed and is then dried.

Figure 3:
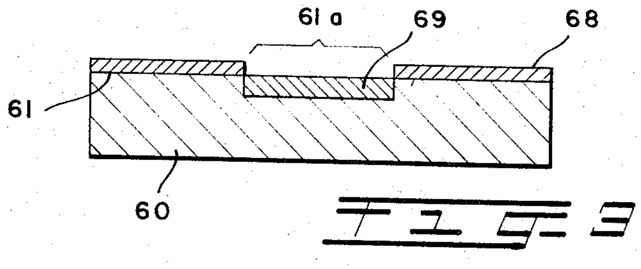
FIG. 3 is a cross-sectional view of the substrate of FIG. 2 after a portion thereof has been ion implanted.

The sensitized surface 61 is selectively exposed to a source of short wavelength ultraviolet radiation 63 by direction thereof at surface 61 through a positive mask 64. The mask 64 has a short wavelength ultraviolet radiation transmitting area 66 and at least one short wavelength ultraviolet radiation opaque area 67 (a plurality of opaque areas 67 are shown in FIG. 1 for illustrative purposes only). The ultraviolet radiation is transmitted only through area 66 of the mask 64 and the strikes area **61*a* of the sensitized surface 61. Area 61*a* is thus rendered incapable of reducing $Pd^{+2}$ ions, contained in a suitable activating solution, to the Pd metal which is destined to be employed as an ion-implantation mask 68 (FIG. 3). Area 61*b* of the surface 61 which is not so exposed to the source of ultraviolet radiation, is capable of reducing $Pd^{+2}$ ions to Pd. The sensitized and short wavelength ultraviolet radiation patterned surface 61 is then activated with a suitable $Pd^{+2}$ activating solution, e.g., a $PdCl_2$ solution, whereby catalytic Pd metal is deposited on area 61*b***.

Figure 2:
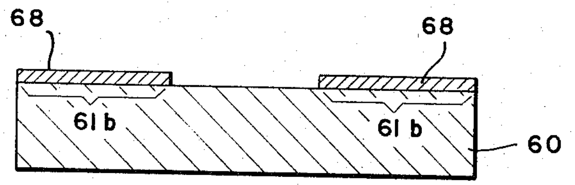
FIG. 2 is a cross-sectional view of the substrate of FIG. 1 taken along line 2—2 of FIG. 1, which has been electrolessly metal deposited.

Referring to FIG. 2, the activated substrate 60 is then immersed in a conventional autocatalytic electroless Pd bath to obtain an electroless Pd metal deposit 68, on area **61*b*, which is destined to act as an ion-implantation mask. The high atomic weight of Pd makes the metal useful as a mask for ion implantation. It is to be understood that deposit 68 which is destined to be utilized as an ion-implantation mask may be further built up by electroplating more Pd thereon. It is also to be understood that other suitable ion-implantation masking metals such as Au, Ni, etc., may be either electroless and/or electroplated on the activated area 61*b* of the substrate 60** to obtain an ion-implantation mask. Suitable electroless and/or electroplating baths, which may be employed, are those well known in the art and will not be elaborated herein. Finally, it is to be understood that although a positive sensitizing solution and positive short wavelength ultraviolet radiation mask have been illustrated, a negative sensitizing solution and a negative short wavelength ultraviolet radiation mask can be employed equally as well.

Referring to FIG. 3, the Pd masked or deposited substrate 60 is subjected to a conventional ion-implantation utilizing techniques well known in the art which will not be elaborated herein. The Pd masked substrate 60 is subjected to a standard ion-implantation source known in the art, whereby a beam of suitable ions or impurities of selected energy are directed at surface 61 of the substrate 60. The suitable ions or impurities are implanted in a discrete portion 69 having a top surface area defined by area **61*a*. The energy of the ions is insufficient to penetrate the Pd deposit or masking layer 68. Suitable ions or impurities are those ions well known in the art which upon subsequent activation or annealing techniques, which are well known in the art, impart different conductivity characteristics to the discrete implanted portion, i.e., portion 69, as compared to the bulk area or region of the substrate 60. The ions or impurities change the portion 69 in either type or in magnitude when the implanted ions are subsequently activated, as for example where substrate 60 is n-type silicon the impurities or implanted ions can change portion 69 to either n+ silicon or p-type silicon, depending, of course, on the implanted ions utilized. It should be noted here, that the depth of the implantation, i.e., of portion 69,** can be controlled by the amount of energy given to the ions.

It is, of course, to be understood that the ion-implantation mask described above is for illustrative purposes only and the mask may have one or a plurality of apertures of various configurations and sizes.

EXAMPLE I

A silicon slice (commercially obtained) was cleaned by immersing the slice in a saturated solution of $CrO_3$ in $H_2SO_4$ maintained at a temperature of 60°C. The slice was held therein for 15 seconds whereafter it was rinsed in running deionized water for 2 minutes. A sensitizing solution was prepared by dissolving 20 grams of $SnCl_2$ and 10 grams of $SnCl_4$ in one liter of water. Upon complete dissolution, 15 grams of $SnCl_2$ were dissolved in the solution. The solution was allowed to stand 24 hours at a temperature of 25°C whereafter 10 ml of 48 weight percent HF were added.

The cleaned and rinsed silicon slice was immersed in the sensitizing solution for 15 seconds at a temperature of 25°C. The sensitized slice was then immersed in a flowing bath of deionized water for 30 seconds and then agitated therein for an additional 30 seconds whereafter the slice was removed and air dried. The sensitized slice was then exposed for 60 seconds to a short wavelength ultraviolet radiation source (a low pressure Hg lamp) through a mask having a short wavelength ultraviolet radiation attenuating grid pattern thereon. The slice was then activated by immersion, for 15 seconds at 25°C, in an aqueous solution comprising 0.25 grams/liter of solution of $PdCl_2$ and 2.5 ml/liter of solution of 37 weight percent Hcl.

The activated slice was rinsed in running deionized water for one minute and was then electrolessly copper plated by immersion in a commercially obtained electroless copper plating bath. An adherent copper-deposited grid pattern was obtained. The electroless copper pattern was 0.4 mil thick.

EXAMPLE II

The procedure of Example I was repeated except the electroless bath employed was an electroless Pd bath. The electroless Pd bath was prepared by first dissolving in water 2 grams/liter of solution $PdCl_2$, 4 ml/liter of solution of 38 weight percent Hcl, 160 ml/liter of solution of 28 weight percent $NH_4OH$ and 27 grams/liter of solution of $NH_4Cl$. The resultant solution was then aged for 24 hours at 25°C, whereafter the solution was filtered. To the filtered solution was added 10 grams/liter of solution of $NaH_2PO_2 \cdot H_2O$ and 27 grams/liter of solution of $NH_4Cl$. The temperature of the electroless Pd bath was maintained at 40°C. A 0.01 mil electroless Pd grid pattern on the silicon slice was obtained.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of selectively depositing an adherent metal deposit on a semiconductor surface, which comprises:

a. sensitizing the surface with a photosensitive sensitizing solution comprising $Sn^{+2}$ ions initially present in a concentration ranging from 0.03 to 0.07 moles/liter of solution, $Sn^{+4}$ ions initially present in a concentration ranging from 0.02 to 0.06 moles/-liter of solution and HF present in a concentration ranging from 0.24 to 0.29 moles/liter of solution;

b. selectively exposing at least one area of said sensitized surface to a source of ultraviolet radiation to render said at least one area incapable of reducing an activating metal ion to an activating metal;

c. treating said selectively exposed sensitized surface with a solution comprising an activating metal ion to reduce said ion and to deposit an activating metal on an unexposed area of said sensitized surface; and d. immersing said activating metal-deposited area in an electroless plating bath, which is catalyzed by said activating metal, to deposit an adherent layer of electroless metal thereon.

2. The method as defined in claim 1, wherein: prior to step (a), said sensitizing solution is prepared by:

a$^1$. dissolving a fraction of the total concentration of said $Sn^{+2}$ ions, in the form of a chloride, in water;

b$^1$. dissolving the total concentration of said $Sn^{+4}$ ions, in the form of a chloride, in the solution resulting from step (a$^1$);

c$^1$. dissolving the remaining amount of said $Sn^{+2}$ ions in the solution resulting from step (b$^1$);

d$^1$. thermally aging the solution resulting from step (c$^1$); and e$^1$. adding said HF to the solution resulting from step (d$^1$); and in step (a) said $Sn^{+2}$ ions are initially present in a concentration of 0.05 moles/liter of solution, said $Sn^{+4}$ ions are initially present in a concentration of 0.04 moles/liter of solution and said HF is present in a concentration of 0.26 moles/liter of solution.

3. The method as defined in claim 1, wherein:

in step (a) said semiconductor surface comprises silicon.

4. In an improved method of forming a semiconductor body of a first conductivity type having therein at least one discrete portion of different conductivity, which comprises the steps of:

a. forming an adherent patterned masking layer on a surface of the body, the pattern of the masking layer leaving at least one predetermined discrete area of the surface of the body exposed; and b. directing a beam of ions of a conductivity determining impurity material of selected energy upon the predetermined selected exposed area, the energy being insufficient to penetrate the masking layer, to implant the ions in the predetermined exposed area of the surface of the body, to form the at least one discrete portion of different conductivity, the improvement comprising:

in step (a), forming the adherent patterned masking layer by:

a$^1$. sensitizing the surface of the semiconductor body with a photosensitive sensitizing solution selected from the group of aqueous photosensitive sensitizing solutions consisting of (1) $Sn^{+2}$ ions initially present in a concentration ranging from 0.03 to 0.07 moles/liter of solution, $Sn^{+4}$ ions initially present in a concentration ranging from 0.02 to 0.06 moles/liter of solution, and HF present in a concentration ranging from 0.24 to 0.29 moles/liter of solution; (2) $Pb^{+2}$ ions initially present in a concentration ranging from 0.03 to 0.07 moles/liter of solution, $Pb^{+4}$ ions initially present in a concentration ranging from 0.02 to 0.06 moles/liter of solution, and HF present in a concentration ranging from 0.24 to 0.29 moles/liter of solution; (3) $Ti^{+2}$ ions initially present in a concentration ranging from 0.03 to 0.07 moles/liter of solution, $Ti^{+4}$ ions initially present in a concentration ranging from 0.02 to 0.06 moles/liter of solution, and HF present in a concentration ranging from 0.24 to 0.29 moles/liter of solution; and (4)

$Fe^{+3}$ ions initially present in a concentration ranging from 0.3 to 0.7 moles/liter of solution and HF present in a concentration ranging from 0.24 to 0.29 moles/liter of solution;

b¹. selectively exposing areas of said sensitized surface to a source of ultraviolet radiation to form a pattern, corresponding to the pattern of the masking layer, capable of reducing an activating metal from an activating metal salt;

c¹. treating said pattern with an activating solution comprising an activating metal salt, to reduce on said pattern an adherent layer of activating metal; and d¹. placing said activating metal-deposited pattern in a suitable electroless metal plating bath, which is catalyzed by the reduced activating metal, to deposit an electroless metal and produce the patterned masking layer.

5. The method as defined in claim 4 which further comprises electroplating the patterned masking layer to deposit a metal masking layer having and adherent desired thickness.

6. The method as defined in claim 4, wherein:

in step (a¹)the semiconductor body comprises silicon, and in step (d¹) the patterned masking layer comprises Pd.

7. The method as defined in claim 4 wherein said sensitizing solution in step (a¹) comprises:

$Sn^{+2}$ ions initially present in a concentration ranging from 0.03 to 0.07 moles/liter of solution, $Sn^{+4}$ ions initially present in a concentration ranging from 0.02 to 0.06 moles/liter of solution, and HF present in a concentration ranging from 0.24 to 0.29 moles/liter of solution.

8. A method of depositing an adherent metal pattern on a surface of a semiconductor substrate, which comprises:

a. treating the surface with a photosensitive sensitizing solution, selected from the group of photosensitive sensitizing solutions consisting of (1) $Sn^{+2}$ ions initially present in a concentration ranging from 0.03 to 0.07 moles/liter of solution, $Sn^{+4}$ ions initially present in a concentration ranging from 0.02 to 0.06 moles/liter of solution, HF present in a concentration ranging from 0.24 to 0.29 moles/liter of solution (2) $Pb^{+2}$ ions initially present in a concentration ranging from 0.03 to 0.07 moles/liter of solution, $Pb^{+4}$ ions initially present in a concentration ranging from 0.02 to 0.06 moles/liter of solution, and HF present in a concentration ranging from 0.24 to 0.29 moles/liter of solution; (3) $Ti^{+2}$ ions initially present in a concentration ranging from 0.03 to 0.07 moles/liter of solution, $Ti^{+4}$ ions initially present in a concentration ranging from 0.02 to 0.06 moles/liter of solution, and HF present in a concentration ranging from 0.24 to 0.29 moles/liter of solution; and (4) $Fe^{+3}$ ions initially present in a concentration ranging from 0.3 to 0.7 moles/liter of solution and HF present in a concentration ranging from 0.24 to 0.29 moles/liter of solution, to sensitize the surface;

b. exposing said sensitized surface to a source of ultraviolet radiation to describe a pattern on said sensitized surface, said described pattern corresponding to the desired metal pattern and being capable of reducing an activating metal from a salt thereof; and c. treating said described pattern with an activating solution, comprising an activating metal salt, to deposit an adherent layer of activating metal on said described pattern.

9. The method as defined in claim 8, wherein:

in step (a) the semiconductor surface comprises silicon.

10. The method as defined in claim 8 wherein said sensitizing solution in step (a) comprises:

$Sn^{+2}$ ions initially present in a concentration ranging from 0.03 to 0.07 moles/liter of solution, $Sn^{+4}$ ions initially present in a concentration ranging from 0.02 to 0.06 moles/liter of solution, and HF present in a concentration ranging from 0.24 to 0.29 moles/liter of solution.

* * * * *

..-566-PT
(6-69)

UNITED STATES PATENT OFFICE
CERTIFICATE OF CORRECTION

Patent No. 3,776,770 Dated December 4, 1973

Inventor(s) D. J. Lando

It is certified that error appears in the above-identified patent and that said Letters Patent are hereby corrected as shown below:

In the section entitled "[75] Inventor" "Mercer City" should read --Mercer County--.

In the Abstract, line 17, "activating-deposited" should read --activating metal-deposited--.

In the specification, Column 1, line 19, "double or" should read --double and--. Column 2, line 29, "activation" should read --activating--. Column 3, lines 16 and 17, "Handbook of Chemistry and Physics" should read --Handbook of Chemistry and Physics--. Column 4, lines 26 and 27, "moles/-liter" should read --moles/liter--; line 58, "$Ti^{+4}Fe^{+3}$" should read --$Ti^{+4}$, $Fe^{+3}$--. Column 7, line 24, "Metallic Coating of Plastics" should read --Metallic Coating of Plastics--; line 38, "Metallic Coating of Plastics" should read --Metallic Coating of Plastics--.

In the claims, Column 11, claim 5, line 21, "to deposit a metal masking layer having and adherent desired thickness" should read --to deposit an adherent metal masking layer having a desired thickness--. Column 12, claim 8, line 5, "solution (2)" should read --solution; (2)--.

Signed and sealed this 8th day of October 1974.

(SEAL)
Attest:

McCOY M. GIBSON JR.
Attesting Officer

C. MARSHALL DANN
Commissioner of Patents